United States Patent
Jeong et al.

(10) Patent No.: US 7,125,767 B2
(45) Date of Patent: Oct. 24, 2006

(54) CAPACITOR INCLUDING A DIELECTRIC LAYER HAVING AN INHOMOGENEOUS CRYSTALLINE REGION AND METHOD OF FABRICATING THE SAME

(75) Inventors: Yong-kuk Jeong, Seoul (KR); Jung-Hyoung Lee, Suwon-si (KR); Seok-Jun Won, Seoul (KR); Dae-Jin Kwon, Seoul (KR); Weon-Hong Kim, Suwon-si (KR); Min-woo Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/296,509

(22) Filed: Dec. 8, 2005

(65) Prior Publication Data

US 2006/0094185 A1    May 4, 2006

Related U.S. Application Data

(62) Division of application No. 11/032,150, filed on Jan. 11, 2005, now Pat. No. 7,002,788.

(30) Foreign Application Priority Data

Jan. 14, 2004  (KR)  .................................. 2004-2761

(51) Int. Cl.
*H01L 21/8242* (2006.01)
*H01L 21/20* (2006.01)

(52) U.S. Cl. ...................... 438/253; 438/393; 438/244; 438/396

(58) Field of Classification Search ................ 438/253, 438/250, 393, 957, 244, 396
See application file for complete search history.

(56) References Cited

U.S. PATENT DOCUMENTS

| 6,436,777 | B1 | 8/2002 | Ota |
| 6,528,328 | B1 | 3/2003 | Aggarwal et al. |
| 7,011,978 | B1 * | 3/2006 | Basceri .......................... 438/3 |
| 2002/0153579 | A1 | 10/2002 | Yamamoto |
| 2003/0017266 | A1 | 1/2003 | Basceri et al. |
| 2003/0038311 | A1 | 2/2003 | Basceri et al. |
| 2003/0104667 | A1 | 6/2003 | Basceri et al. |

* cited by examiner

*Primary Examiner*—Chuong Anh Luu
(74) *Attorney, Agent, or Firm*—Lee & Morse, P.C.

(57) ABSTRACT

In a capacitor, and a method of fabricating the same, the capacitor includes a lower electrode, a dielectric layer on the lower electrode, and an upper electrode on the dielectric layer, wherein the dielectric layer includes a lower dielectric region contacting the lower electrode, an upper dielectric region contacting the upper electrode, and at least one middle dielectric region between the lower dielectric region and the upper dielectric region, the at least one middle dielectric region having a less crystalline region than both the lower dielectric region and the upper dielectric region.

19 Claims, 4 Drawing Sheets

CAPACITOR INCLUDING A DIELECTRIC LAYER HAVING AN INHOMOGENEOUS CRYSTALLINE REGION AND METHOD OF FABRICATING THE SAME

CROSS REFERENCE TO RELATED APPLICATION(S)

This is a divisional application based on application Ser. No. 11/032,150, filed Jan. 11, 2005 now Pat. No. 7,002,788, the entire contents of which is hereby incorporated by reference.

BACKGROUND OF THE INVENTION

1. Field of the Invention

The present invention relates to a semiconductor device and a method of fabricating the same. More particularly, the present invention relates to a capacitor including a dielectric layer having an inhomogeneous crystalline region, and a method of fabricating the same.

2. Discussion of the Related Art

With an increase in the integration of a semiconductor device, a minimum line width of a device is decreased down to a level less than 1 μm, and a capacitor area is also reduced. With such a trend in the semiconductor industry, in order to prevent deterioration of device performance, and a decrease in reliability thereof, a capacitance should be sufficiently provided and a breakdown voltage should be sufficiently high, even though a size of a capacitor is reduced. Particularly, a capacitor, which is used in an analog element such as a CMOS image sensor, a liquid crystal display driver integrated circuit (LDI), a plasma display panel driver integrated circuit (PDI), or the like, should provide a breakdown voltage above a predetermined voltage level.

Methods of increasing a capacitance of a capacitor include increasing an area of the capacitor, forming a capacitor dielectric layer of a high-dielectric-constant material, or reducing a thickness of a dielectric layer. However, there remain many limits to increasing an area of the capacitor with an increase in the integration of a semiconductor device. Also, there remains a limit to increasing a capacitance of the capacitor by reducing a thickness of a silicon oxide ($SiO_2$) layer, which is generally used as a capacitor dielectric layer.

Further, a maximum voltage that can be stably supplied to a capacitor, i.e., breakdown voltage, depends on a dielectric strength and a thickness of a dielectric layer. While a thickness of the dielectric layer needs to be reduced in order to increase capacitance, a thickness of the dielectric layer needs to remain above a predetermined level in order to increase breakdown voltage. Therefore, a high-dielectric-constant material is used for the capacitor dielectric layer, thereby achieving a capacitance without a reduction in the thickness of the dielectric layer, and preventing a decrease in breakdown voltage.

FIG. 1 illustrates a sectional view of a conventional capacitor fabricated by conventional technology. The capacitor C includes a lower electrode 13, a dielectric layer 14, and an upper electrode 15. The lower electrode 13 is connected to a semiconductor substrate 10 via a plug 12 passing through an interlayer insulating layer 11, which is formed on the semiconductor substrate 10. The dielectric layer 14 may be composed of a high-dielectric-constant material such as $(Ba_x, Sr_{1-x})TiO_3$, $TiO_2$, $Ta_2O_5$, $ZrO_2$, Zr-silicate, $HfO_2$, Hf-silicate, $Al_2O_3$, $Y_2O_3$, $Pb(Zr, Ti)O_3$, or the like. However, use of a crystalline high-k dielectric layer causes a problem with respect to a decrease in breakdown voltage. For example, since a crystallization temperature of $HfO_2$ is low, when depositing a thick $HfO_2$ layer, the $HfO_2$ may be easily crystallized during the deposition, thereby decreasing breakdown voltage.

SUMMARY OF THE INVENTION

The present invention is therefore directed to a capacitor including a dielectric layer having an inhomogeneous crystalline region, and a method of fabricating the same, which substantially overcome one or more of the problems due to the limitations and disadvantages of the related art.

It is a feature of an embodiment of the present invention to provide a capacitor including a dielectric layer having an inhomogeneous crystalline region that exhibits good characteristics with respect to leakage current and breakdown voltage.

It is another feature of an embodiment of the present invention to provide a method of fabricating a capacitor including a dielectric layer having an inhomogeneous crystalline region.

At least one of the above and other features and advantages of the present invention may be realized by providing a capacitor including a lower electrode, a dielectric layer on the lower electrode, and an upper electrode on the dielectric layer, wherein the dielectric layer includes a lower dielectric region contacting the lower electrode, an upper dielectric region contacting the upper electrode, and at least one middle dielectric region between the lower dielectric region and the upper dielectric region, the at least one middle dielectric region having a less crystalline region than both the lower dielectric region and the upper dielectric region.

The dielectric layer may be formed of one or more layers selected from the group consisting of a hafnium oxide layer, an aluminum oxide layer, a tantalum oxide layer, a titanium oxide layer, a zirconium oxide layer, a lanthanum oxide layer, a $(Ba_x, Sr_{1-x})TiO_3$ layer, a $Pb(Zr, Ti)O_3$ layer, and a mixture thereof.

A concentration of impurities in the middle dielectric region may be higher than concentrations of impurities in both the lower dielectric region and the upper dielectric region.

The middle dielectric region may be formed of an amorphous dielectric layer, and the upper dielectric region and the lower dielectric region may be formed of crystalline dielectric layers.

The lower dielectric region, the middle dielectric region, and the upper dielectric region may be each formed of a hafnium oxide layer.

The lower electrode and the upper electrode may be formed of one layer selected from the group consisting of a titanium layer, a titanium nitride layer, a tantalum layer, a tantalum nitride layer, a tungsten layer, a tungsten nitride layer, an aluminum layer, a copper layer, a ruthenium layer, a ruthenium oxide layer, a platinum layer, an iridium layer, an iridium oxide layer, a polysilicon layer, and a mixture thereof.

At least one of the above and other features and advantages of the present invention may be realized by providing a method of fabricating a capacitor including preparing a substrate, forming a lower conductive layer on the substrate, forming a dielectric layer on the lower conductive layer, the dielectric layer including a lower dielectric region contacting the lower conductive layer, an upper dielectric region formed as the uppermost region of the dielectric layer, and at least one middle dielectric region between the lower dielectric region and the upper dielectric region, at least one middle dielectric region having a less crystalline region than both of the lower dielectric region and the upper dielectric region, forming an upper conductive layer on the dielectric layer, and sequentially patterning the upper conductive layer, the dielectric layer, and the lower conductive layer to form an upper electrode, a patterned dielectric layer, and a lower electrode, respectively.

The dielectric layer may be composed of one or more layers selected from the group consisting of a hafnium oxide layer, an aluminum oxide layer, a tantalum oxide layer, a titanium oxide layer, a zirconium oxide layer, a lanthanum oxide layer, a $(Ba_x, Sr_{1-x})TiO_3$ layer, a $Pb(Zr, Ti)O_3$ layer, and a mixture thereof.

Forming the dielectric layer may include using atomic layer deposition (ALD) technology or chemical vapor deposition (CVD) technology.

A concentration of impurities in the middle dielectric region layer may be higher than concentrations of impurities in both the lower dielectric region and the upper dielectric region.

The lower dielectric region, the middle dielectric region, and the upper dielectric region may be formed of hafnium oxide layers.

The lower dielectric region and the upper dielectric region may be formed while supplying an oxidizing gas selected from the group consisting of $H_2O$, $O_3$, $O_2$ plasma, and $N_2O$ plasma.

The middle dielectric region may be formed while supplying $O_2$ as an oxidizing gas.

The method may further include performing a curing process using a gas including oxygen, after forming the middle dielectric region.

The gas including oxygen may be selected from the group consisting of $O_2$, $O_3$, $N_2O$, $O_2$ plasma, $N_2O$ plasma, and a mixture thereof.

The lower electrode and the upper electrode may be formed of one layer selected from the group consisting of a titanium layer, a titanium nitride layer, a tantalum layer, a tantalum nitride layer, a tungsten layer, a tungsten nitride layer, an aluminum layer, a copper layer, a ruthenium layer, a ruthenium oxide layer, a platinum layer, an iridium layer, an iridium oxide layer, a polysilicon layer, and a mixture thereof.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
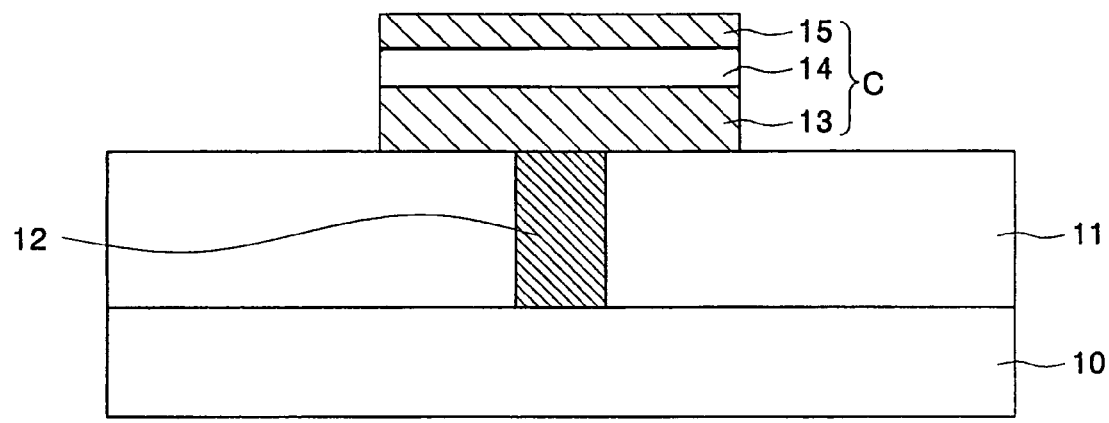
FIG. 1 illustrates a sectional view of a conventional capacitor fabricated by a conventional method.

Korean Patent Application No. 2004-2761, filed Jan. 14, 2004, in the Korean Intellectual Property Office, and entitled: "Capacitor Including Dielectric Layer Having Inhomogeneous Crystalline Region and Method of Fabricating the Same," is incorporated herein by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
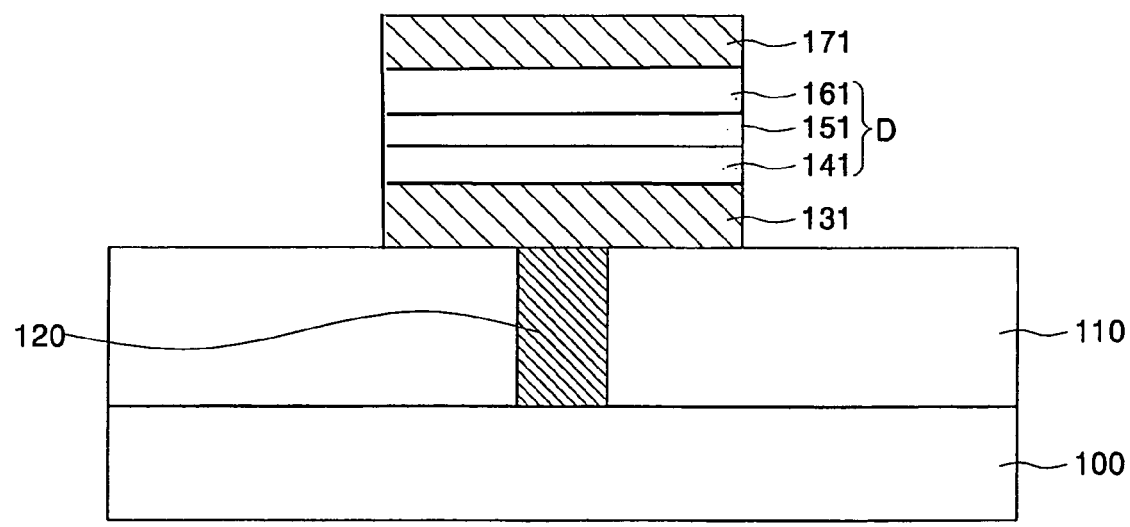
FIG. 2 illustrates a sectional view of a capacitor according to an embodiment of the present invention.

Referring to FIG. 2, a capacitor of a semiconductor device according to an embodiment of the present invention includes a lower electrode 131, a dielectric layer D having inhomogeneous crystalline regions on the lower electrode 131, and an upper electrode 171 on the dielectric layer D. A crystalline region is a region in which molecules are uniformly aligned to form a crystal lattice. Inhomogeneous crystalline regions are formed by combining crystalline regions and amorphous regions.

The dielectric layer D includes a lower region 141, a middle region 151, which has a less crystalline region than that of the lower region 141, and an upper region 161, which has a more crystalline region than that of the middle region 151. Accordingly, the dielectric layer D may have a structure in which a layer having a more crystalline region and a layer having a less crystalline region are alternately stacked. Thus, the dielectric layer D may have a structure in which a crystalline dielectric layer and an amorphous dielectric layer are alternately stacked. For example, the lower region 141 and the upper region 161 may be composed of one layer selected from the group consisting of a crystalline hafnium oxide layer, a crystalline aluminum oxide layer, a crystalline tantalum oxide layer, a crystalline titanium oxide layer, a crystalline zirconium oxide layer, a crystalline lanthanum oxide layer, a crystalline $(Ba_x, Sr_{1-x})TiO_3$ layer, a crystalline $Pb(Zr, Ti)O_3$ layer, and a mixture thereof. The middle region 151 may be formed of one layer selected from the group consisting of an amorphous hafnium oxide layer, an amorphous aluminum oxide layer, an amorphous tantalum oxide layer, an amorphous titanium oxide layer, an amorphous zirconium oxide layer, an amorphous lanthanum oxide layer, an amorphous $(Ba_x, Sr_{1-x})TiO_3$ layer, an amorphous $Pb(Zr, Ti)O_3$ layer, and a mixture thereof. The lower region 141, the middle region 151, and the upper region 161 may be composed of a same material or a different material. For example, the lower region 141 may be composed of a hafnium oxide layer, the middle region 151 may be formed of a zirconium oxide layer, and the upper region 161 may be formed of a tantalum oxide layer. The lower region 141 and the upper region 161 may be formed of a hafnium oxide layer having a relatively more crystalline region with a thickness of about 65 to 75 Å, and the middle region 151 may be formed of a hafnium oxide layer having a relatively less crystalline region with a thickness of about 55 to 65 Å. Further, a concentration of the impurities such as carbon or the like in the middle region 151 may be higher than a concentration of the impurities in the lower region 141 and the upper region 161.

The lower electrode 131 may be connected to a conductive layer such as a semiconductor substrate 100 via a plug 120 passing through an interlayer insulating layer 110 formed on the semiconductor substrate 100. The lower electrode 131 may have various structures. For example, the lower electrode 131 may have a cylindrical structure. The lower electrode 131 and the upper electrode 171 may be formed of one layer selected from the group consisting of a titanium layer, a titanium nitride layer, a tantalum layer, a tantalum nitride layer, a tungsten layer, a tungsten nitride layer, an aluminum layer, a copper layer, a ruthenium layer, a ruthenium oxide layer, a platinum layer, an iridium layer, an iridium oxide layer, a polysilicon layer, and a mixture thereof.

When layers are formed of the same material and have the same concentration of impurities, a leakage current flowing through an amorphous layer is greater than a leakage current flowing through a crystalline layer.

However, breakdown voltage characteristics of an amorphous layer are better than breakdown voltage characteristics of a crystalline layer. Therefore, in the embodiment of the present invention, the middle region 151 having a less crystalline region, i.e., an amorphous region, is interposed between the lower region 141 and the upper region 161, both of which have a more crystalline region, thereby improving characteristics of leakage current and breakdown voltage.

Hereinafter, a method of fabricating a capacitor according to an embodiment of the present invention will be described with reference to FIGS. 3A through 3D.

Figure 3A:
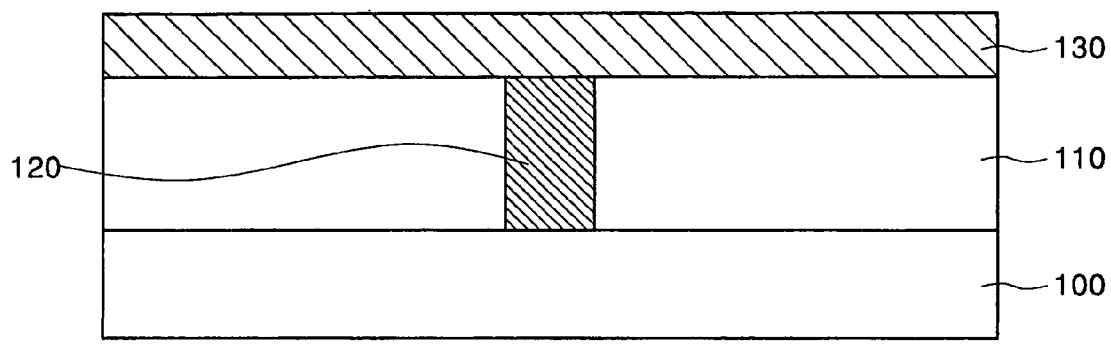
FIGS. 3A to 3D illustrate sectional views of stages in a process of fabricating a capacitor according to an embodiment of the present invention.

Referring to FIG. 3A, a lower conductive layer 130 to form a lower electrode is formed on an interlayer insulating layer 110 having a plug 120 formed therethrough, the interlayer insulating layer 110 being formed on a semiconductor substrate 100. The lower conductive layer 130 may be formed of one layer selected from the group consisting of a titanium (Ti) layer, a titanium nitride (TiN) layer, a tantalum (Ta) layer, a tantalum nitride (TaN) layer, a tungsten (W) layer, a tungsten nitride (WN) layer, an aluminum (Al) layer, a copper (Cu) layer, a ruthenium (Ru) layer, a ruthenium oxide ($RuO_2$) layer, a platinum (Pt) layer, an iridium (Ir) layer, an iridium oxide ($IrO_2$) layer, a polysilicon layer, and multi-layers including a mixture thereof. Preferably, the conductive layer 130 may be formed by depositing TiN using physical vapor deposition (PVD) technology.

Figure 3B:
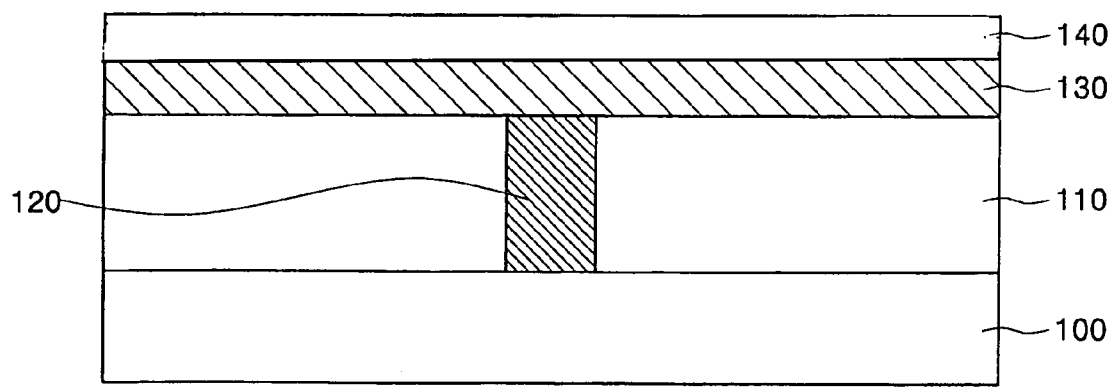

Referring to FIG. 3B, a lower dielectric layer 140 is formed on the lower conductive layer 130, the lower dielectric layer 140 having a relatively more crystalline region. The lower dielectric layer 140 may be formed of one layer selected from the group consisting of a hafnium oxide layer, an aluminum oxide layer, a tantalum oxide layer, a titanium oxide layer, a zirconium oxide layer, a lanthanum oxide layer, a BST layer, and a PZT layer, or multi-layers including a mixture thereof. The lower dielectric layer 140 may be formed using a chemical vapor deposition (CVD) method or an atomic layer deposition (ALD) method. Preferably, the lower dielectric layer 140 may be formed using an ALD method by repeatedly performing a series of processing including supplying a deposition source, purging, supplying an oxidizing gas, and purging, inside a deposition chamber, until a desired thickness of the lower dielectric layer 140 is achieved. For example, when the lower dielectric layer 140 is formed of a hafnium oxide layer, a tetra-ethyl-methyl amino hafnium (TEMAH) as a deposition source may be supplied. $H_2O$ or $O_3$ may be employed as the oxidizing gas for forming a hafnium oxide layer having a relatively more crystalline region. As such, in the case of supplying $H_2O$ or $O_3$ as the oxidizing gas, the hafnium oxide layer can be formed with an excellent reactivity, few impurities, and a relatively more crystalline region. Alternatively, the lower dielectric layer 140 may be formed using $O_2$ plasma or $N_2O$ plasma as an oxidizing gas. A deposition temperature of the lower dielectric layer 140 may be in the range of about 100 to 600 ° C. The lower dielectric layer 140 may have a thickness of about 65 to 75 Å.

Figure 3C:
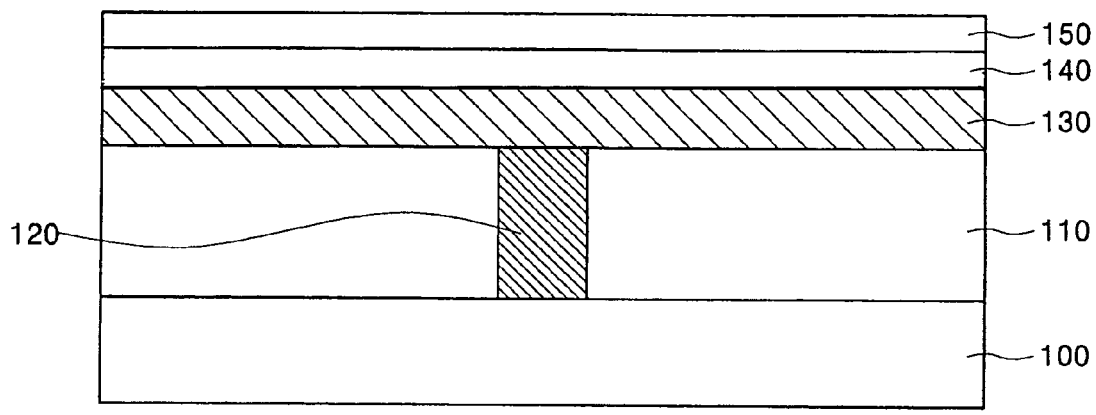

Referring to FIG. 3C, a middle dielectric layer 150 having a relatively less crystalline region, i.e., an amorphous region, is formed on the lower dielectric layer 140. The middle dielectric layer 150 may be formed using an ALD method by repeatedly performing a series of processes including supplying a deposition source, purging, supplying an oxidizing gas, and purging. TEMAH as a deposition source may be supplied, and $O_2$ may be employed as an oxidizing gas for forming a hafnium oxide layer having the relatively less crystalline region. If $O_2$ is supplied as the oxidizing gas, reactivity is relatively decreased as compared to when $H_2O$ or $O_3$ is supplied as the oxidizing gas, and thus, the hafnium oxide layer can be formed with greater impurities, and the relatively less crystalline region. Since the hafnium oxide layer, which has more impurities and a less crystalline region, has poor characteristics in its leakage current, a curing process may be performed after forming the middle dielectric layer 150 using gas including oxygen, in order to compensate for the poor characteristics of the leakage current. For example, the curing process may be performed in the atmosphere of $O_2$, $O_3$, or $N_2O$ gas, or using plasma from $O_2$ or $N_2O$ gas. The middle dielectric layer 150 may be formed with a thickness of about 55 to 65 Å.

Figure 3D:
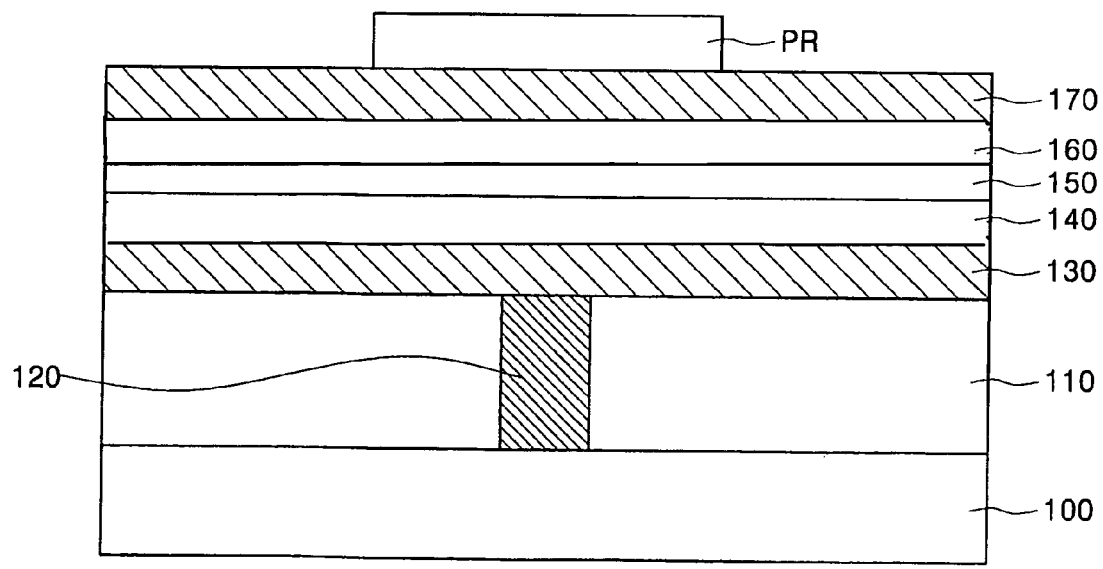

Referring to FIG. 3D, an upper dielectric layer 160, which has a relatively more crystalline region, is formed on the middle dielectric layer 150, and an upper conductive layer 170 to form an upper electrode is formed on the upper dielectric layer 160. Then, a photoresist pattern PR for defining a capacitor is formed on the conductive layer 170. The upper dielectric layer 160 and the upper conductive layer 170 may be composed of the same materials as the lower dielectric layer 140 and the lower conductive layer 130, respectively.

The upper conductive layer 170, the dielectric layers 160, 150, 140, and the lower conductive layer 130 are then patterned using the photoresist pattern PR as an etch mask. Thus, the upper electrode 171, the dielectric layer D, and the lower electrode 131 (as shown in FIG. 2) are formed from the upper conductive layer 170, the dielectric layers 160, 150, 140, and the lower conductive layer 130, respectively. The dielectric layer D includes the upper region 161 formed from the upper dielectric layer 160, the middle region 151 formed from the middle dielectric layer 150, and the lower region 141 formed from the lower dielectric layer 140. The lower region 141 and the upper region 161 have relatively more crystalline regions, and the middle region 151 has a relatively less crystalline region, i.e., an amorphous region, than the upper region 161 and the lower region 141.

EXAMPLE

Figure 4:
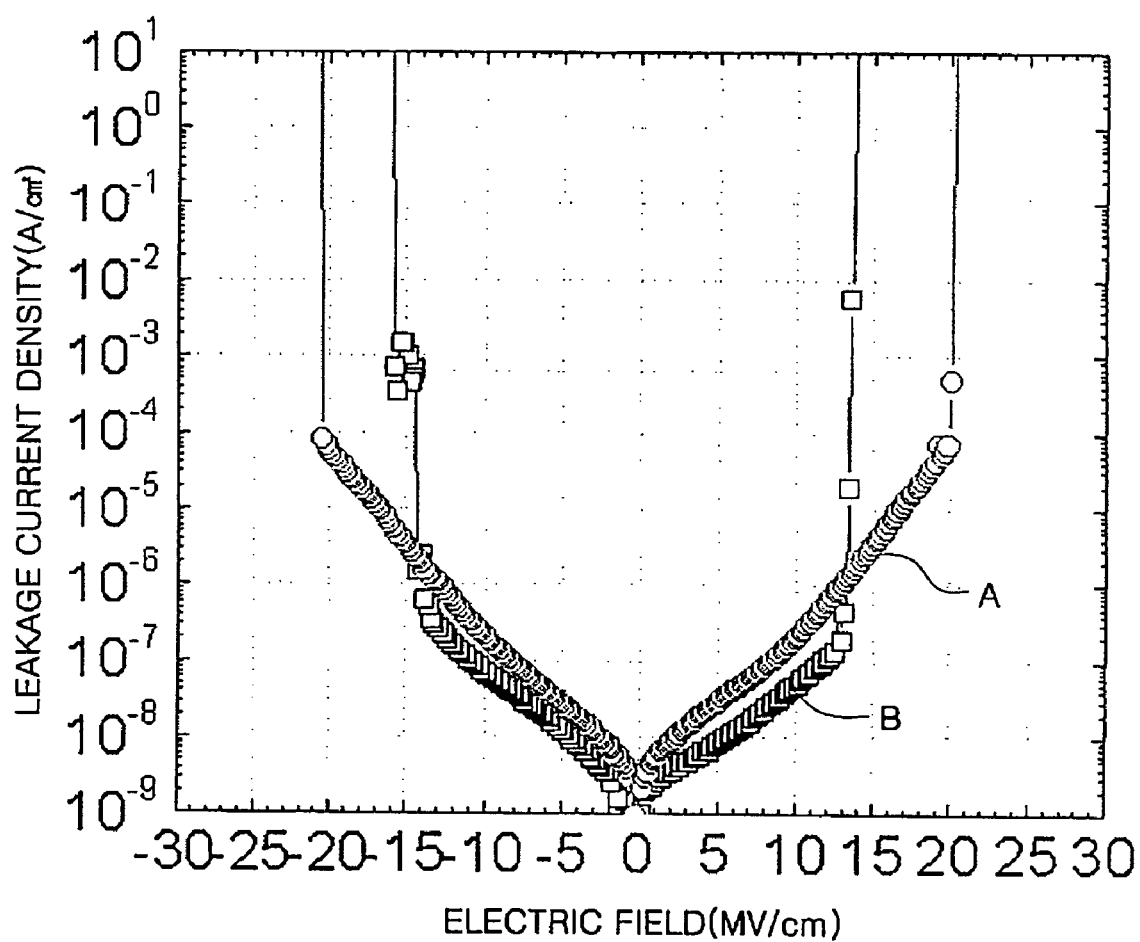
FIG. 4 is a graph comparing characteristics of a conventionally-fabricated capacitor and a capacitor according to an embodiment of the present invention.

FIG. 4 is a graph comparing characteristics of a conventionally-fabricated capacitor and a capacitor according to an embodiment of the present invention.

According to an embodiment of the present invention, FIG. 4 shows characteristics of leakage current density and breakdown voltage of a capacitor according to an embodiment of the present invention (capacitor A) including a middle dielectric region, which has a less crystalline region, and is disposed between an upper dielectric region and a lower dielectric region, both of which have a relatively more crystalline region, and a conventional capacitor including a crystalline dielectric layer (capacitor B). The upper dielectric region and the lower dielectric region of capacitor A are formed by supplying TEMAH as a deposition source, and supplying $H_2O$ as an oxidizing gas, thereby forming hafnium oxide layers with a thickness of 70 Å. The middle dielectric region of capacitor A is formed by supplying TEMAH as a deposition source, and supplying $O_2$ as an oxidizing gas, thereby forming a hafnium oxide layer with a thickness of 60 Å. After deposition of the dielectric layer of capacitor A, curing process is performed in an O3 atmosphere. The dielectric layer of capacitor B is formed of a crystalline hafnium oxide layer with a thickness of 200 Å. The lower electrode and the upper electrode of capacitor A and capacitor B are formed by depositing TiN using PVD technology. Capacitor A including a dielectric layer, which consists of a hafnium oxide layer having a more crystalline region, a hafnium oxide layer having a less crystalline region, and a hafnium oxide layer having a more crystalline region, exhibited similar characteristics in leakage current as compared to capacitor B including a crystalline hafnium oxide layer, but showed significant improvement with respect to breakdown voltage. More specifically, capacitor A and capacitor B both have a dielectric layer having a thickness of 200 Å. An electric field by breakdown voltage of capacitor A is about 20 MV/cm, and an electric field by breakdown voltage of capacitor B is about 13 to 14 MV/cm. Accordingly, capacitor A exhibited superior results with respect to breakdown voltage as compared to capacitor B.

As described above, according to the present invention, there is provided a dielectric layer including a lower region, a middle region having a less crystalline region than the lower region, and an upper region having a more crystalline region than the middle region, thereby improving characteristics of leakage current and breakdown voltage of a capacitor.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a capacitor, comprising:
   preparing a substrate;
   forming a lower conductive layer on the substrate;
   forming a dielectric layer on the lower conductive layer, the dielectric layer including a lower dielectric region contacting the lower conductive layer, an upper dielectric region formed as the uppermost region of the dielectric layer, and at least one middle dielectric region between the lower dielectric region and the upper dielectric region, at least one middle dielectric region having a less crystalline region than both of the lower dielectric region and the upper dielectric region;
   forming an upper conductive layer on the dielectric layer; and
   sequentially patterning the upper conductive layer, the dielectric layer, and the lower conductive layer to form an upper electrode, a patterned dielectric layer, and a lower electrode, respectively.

2. The method as claimed in claim 1, wherein the dielectric layer is composed of one or more layers selected from the group consisting of a hafnium oxide layer, an aluminum oxide layer, a tantalum oxide layer, a titanium oxide layer, a zirconium oxide layer, a lanthanum oxide layer, a $(Ba_x, Sr_{1-x})TiO_3$ layer, a $Pb(Zr, Ti)O_3$ layer, and a mixture thereof.

3. The method as claimed in claim 1, wherein forming the dielectric layer comprises using atomic layer deposition (ALD) technology or chemical vapor deposition (CVD) technology.

4. The method as claimed in claim 1, wherein a concentration of impurities in the middle dielectric region layer is higher than concentrations of impurities in both the lower dielectric region and the upper dielectric region.

5. The method as claimed in claim 1, wherein the lower dielectric region, the middle dielectric region, and the upper dielectric region are formed of hafnium oxide layers.

6. The method as claimed in claim 3, wherein the lower dielectric region and the upper dielectric region are formed while supplying an oxidizing gas selected from the group consisting of $H_2O$, $O_3$, $O_2$ plasma, and $N_2O$ plasma.

7. The method as claimed in claim 3, wherein the middle dielectric region is formed while supplying $O_2$ as an oxidizing gas.

8. The method as claimed in claim 7, further comprising performing a curing process using a gas including oxygen, after forming the middle dielectric region.

9. The method as claimed in claim 8, wherein the gas including oxygen is selected from the group consisting of $O_2$, $O_3$, $N_2O$, $O_2$ plasma, $N_2O$ plasma, and a mixture thereof.

10. The method as claimed in claim 1, further comprising performing a curing process using a gas including oxygen, after forming the middle dielectric region.

11. The method as claimed in claim 10, wherein the gas including oxygen is selected from the group consisting of $O_2$, $O_3$, $N_2O$, $O_2$ plasma, $N_2O$ plasma, and a mixture thereof.

12. The method as claimed in claim 1, wherein a concentration of impurities in the middle dielectric region is higher than concentrations of impurities in both the lower dielectric region and the upper dielectric region.

13. The method as claimed in claim 1, wherein the lower electrode and the upper electrode are formed of one layer selected from the group consisting of a titanium layer, a titanium nitride layer, a tantalum layer, a tantalum nitride layer, a tungsten layer, a tungsten nitride layer, an aluminum layer, a copper layer, a ruthenium layer, a ruthenium oxide layer, a platinum layer, an iridium layer, an iridium oxide layer, a polysilicon layer, and a mixture thereof.

14. The method as claimed in claim 1, wherein forming the lower dielectric region includes depositing at a temperature of about 100° C. to about 600° C.

15. The method as claimed in claim 1, wherein the middle dielectric region is thinner than the lower dielectric region.

16. The method as claimed in claim 1, wherein the upper dielectric region has a same thickness as the lower dielectric region.

17. The method as claimed in claim 1, wherein the upper dielectric region has a same thickness as the lower dielectric region.

18. The method as claimed in claim 1, wherein the upper dielectric region is made of a same material as the lower dielectric region.

19. The method as claimed in claim 8, wherein the upper conductive layer region is made of a same material as the lower conductive layer.

* * * * *